United States Patent [19]

DuRose

[11] 4,234,628
[45] Nov. 18, 1980

[54] TWO-STEP PREPLATE SYSTEM FOR POLYMERIC SURFACES

[75] Inventor: Arthur H. DuRose, Pinellas Park, Fla.

[73] Assignee: The Harshaw Chemical Company, Cleveland, Ohio

[21] Appl. No.: 964,306

[22] Filed: Nov. 28, 1978

Related U.S. Application Data

[63] Continuation-in-part of Ser. No. 687,261, May 14, 1976.

[51] Int. Cl.² ............................ B05D 3/04; C23C 3/02
[52] U.S. Cl. ............................... 427/305; 427/304; 427/306; 427/343; 427/404; 427/419.2; 427/443.1
[58] Field of Search ........................ 427/304–306, 427/430 A, 404, 419 R, 343

[56] References Cited

U.S. PATENT DOCUMENTS

| | | | |
|---|---|---|---|
| 3,925,578 | 12/1975 | Polichette | 427/343 |
| 3,930,963 | 1/1976 | Polichette | 427/306 |
| 3,958,048 | 5/1976 | Donovan et al. | 427/306 |
| 3,959,547 | 5/1976 | Polichette | 427/306 |
| 3,962,494 | 6/1976 | Nuzzi | 427/306 |
| 3,993,801 | 11/1976 | Feldstein | 427/306 |
| 4,035,227 | 7/1977 | Doty et al. | 427/306 |
| 4,036,707 | 7/1977 | Januschkowetz | 427/306 |

*Primary Examiner*—John D. Smith
*Assistant Examiner*—Janyce A. Bell
*Attorney, Agent, or Firm*—James A. Lucas

[57] ABSTRACT

Non-metallic surfaces are prepared to receive an electroless metal deposit of copper, gold or nickel using a two-step adsorption procedure to sensitize the surface. The surface is first immersed in a bath containing copper in solution or suspension to adsorb the copper on the surface, followed by contact with a nickel or cobalt bath at a pH above 4 to encourage adsorption of the second metal. The adsorbed metals are then reduced with a borohydride reducing agent, with the nickel or cobalt serving to catalyze the reduction of the copper. The surface can be rinsed between the two adsorption steps without decreasing the effectiveness of the treatment.

8 Claims, No Drawings

TWO-STEP PREPLATE SYSTEM FOR POLYMERIC SURFACES

RELATED APPLICATIONS

This application is a continuation in part of an earlier application, Ser. No. 687,261 filed May 14, 1976.

BACKGROUND OF THE INVENTION

1. Field of the Invention

This invention relates to the preparation of surfaces of non-metallic materials, typically synthetic resins, for the subsequent electroless deposition of metals. The invention is useful in the printed circuit and electronic industry, and for the manufacture of decorative articles and parts.

2. Description of Prior Art

For several years, there has been a great deal of activity devoted to the preparation of non-metallic bases and substrates for electroless plating. One of the most annoying problems has been the fact that the metal does not readily plate on the non-metallic surface without considerable preparation of the surface. In one method, the specific steps of preparation involve a thorough cleaning of the substrate, etching or mechanically roughing the substrate, sensitizing the substrate by immersion in a tin chloride solution, creating nucleating centers by immersion of the substrate in a bath of a precious metal as a complex, colloid or dissolved salt, and reducing the precious metal with the tin and/or other agent such as dimethylamine borane.

After forming the catalytic nucleii on the surface of the substrate, a metal layer is deposited by electroless plating. This may be followed by an electroplating step.

The literature is replete with detailed descriptions of systems for the preparation of non-metallic, normally hydrophobic surfaces. In the system described in U.S. Pat. No. 3,011,920, No. 3,532,518 and No. 3,681,257 and others, stannous chloride and palladium chloride are used simultaneously or sequentially to provide a sensitized or activated surface for plating. An electroless metal layer is then deposited on the catalytically activated substrate. There are a number of improvement patents based upon this same general procedure. They all, however, rely upon the use of an expensive metal such as palladium to provide the nucleating sites on the substrate.

A series of interrelated patents including U.S. Pat. No. 3,657,003, No. 3,783,005 and No. 3,873,357-8-9 describe a method of preparing a non-metallic substrate having a "non-wettable" surface for electroless deposition. The method includes a first step of wetting the surface with a "hydrous oxide colloid" prepared from a long list of noble and non-noble metals including nickel, tin, lead and copper. The hydrous copper oxide has a deep blue color. Depending upon conditions and end use, the wetting step is accompanied by or followed with an activating step using noble metal ions of palladium, platinum, silver or gold followed by reduction of the ions. As an intermediate step, the use of a colloidal sensitizing sol of a hydrous oxide of tin, titanium, lead, vanadium, chromium, iron or bismuth (referred to as a positive colloidal sensitizing sol in U.S. Pat. No. 3,873,359) is used on the surface before deposition of the activating metal. In all instances, two or more metals are used in the pretreatment, one of them being an expensive metal such as palladium or platinum.

Other patents such as U.S. No. 3,772,078 (Polichette et al), No. 3,962,494 (Nuzzi) and U.S. Pat. No. 3,959,547 (Polichette et al) teach a method of coating a plastic surface with a metal salt in an aqueous or organic solution followed by reduction with a chemical reducing agent such as a borohydrate and a secondary reducer such as radiant energy or a compound such as formaldehyde activated by a change in pH. Reducible salts capable of catalyzing electroless metal are copper, nickel, cobalt or mixtures thereof. Preferably an accelerator such as nickel, cobalt, tin or the like is also included. However, success of the process depends upon drying the metal salts on the surface without rinsing, before reduction. The presence of the salt layer adversely affects adhesion of the subsequent electroless deposit, and in addition tends to promote non-uniformity or blotchiness and rapid deterioration of the reducing solution. Conversely, if the surface is rinsed, the salts are largely removed from the surface and their effectiveness is lost.

U.S. Pat. No. 3,993,801 (Feldstein) describes a method of preplating a non-metallic substrate by dipping the substrate (preferably etched) first into a primer containing mono or divalent copper to form copper sites on the surface. The primed substrate is then placed in a "developer bath" containing a chemical reducing agent and a salt of nickel, cobalt or copper. The reducing agent reduces the copper previously applied and then causes the nickel, cobalt or copper from the develper bath to electrolessly deposit on or coat the copper to "intensify" the copper sites. This is followed by conventional electroless plating. Because of the instability of the developer bath and its sensitivity to spontaneous decomposition, the process has limited commercial value.

Yet other patents such as U.S. No. 3,058,845 to Hendricks use a water solution of a specific salt such as copper nitrate to impregnate certain specific polymeric material, followed without rinsing by chemical reduction with sodium borohydride.

U.S. Pat. No. 4,048,354 (Feldstein) describes a preplate process involving dipping a dielectric substrate into a stabilized colloidal dispersion of hydrous metal oxides using metals such as copper, accompanied with or followed by the application of a "reactivity modifier" causing the colloid to become negatively charged and which serves to promote activation of the colloid in the dispersion by overcoming or counteracting the effect of the stabilizer. Several organic or inorganic modifiers are suggested for this purpose comprising two surfactants and soluble halides. Metals and metal ions are not suggested or proposed as reactivity modifiers nor is there any suggestion that these modifiers catalyze the electroless deposition of metal onto the copper surface.

Still another process, disclosed in a pending patent application involves the use of a positively charged basic copper sol which is adsorbed on a non-metallic surface and which is then reduced with borohydride, hydrazine or a borane compound. The process is limited to the use of sols prepared from copper chloride, copper acetate or copper propionate. The stability of the sol must be closely controlled by regulation of the pH and the temperature. Sodium borohydride is the preferred reducing agent and is used in a concentration of between 1 and 50 g/l.

BRIEF DESCRIPTION OF THE INVENTION

One of the objects of the present invention is to overcome many of the problems of the prior art methods of preparing a non-metallic substrate for the deposition of a metal layer. Another object involves a mechanism of sensitizing synthetic polymeric resins without using expensive metals such as palladium or platinum to catalyst a metal deposit. Yet another object of the present invention is the use of a preplate system which permits rinsing of the synthetic resin surface without removal of the activating precursor from the surface.

Still another object is the use of a dependable two step preplate system on a variety of non-metallic substrates, said system characterized by ease of use, reproducibility, and the ability to obtain good adhesion between the metal and the roughened or etched substrate while permitting use of a more dilute reducing solution.

These and other objects are achieved according to the present invention by adsorbing a cupric or cuprous compound on a polymeric surface from a solution or a suspension, followed with or without an intermediate rinsing step, by contacting the surface with a nickel or cobalt solution or suspension for a period of between 15 seconds and 10 minutes at a pH of 4 or above. The excess nickel or cobalt is rinsed from the surface after which the adsorbed metals are reduced with a borohydride reducing agent. The reduction step is followed by an electroless deposition of nickel, copper or gold which can in turn be followed by the electrodeposition of a suitable metal.

DETAILED DESCRIPTION

In more detail, the present invention constitutes an improved method of pretreating a normally non-platable surface to receive an electrodeposit. The method is applicable to a wide variety of non-metallic surfaces including etched or unetched ABS (acrylonitrile butadiene styrene), PTFE (polytetrafluoroethylene) and various other synthetic resin materials such as polypropylene, polyphenylene oxide, and polyarylether.

The surface is prepared by conventional methods including one or more cleaning, degreasing, abrasion or etching steps to remove grease, dirt, oxide films and the like. A suitable etchant such as an aqueous solution of 400 g/l of $CrO_3$ and 370 g/l of $H_2SO_4$ is typically used to clean and etch the surface of many synthetic polymeric resins. Etching promotes good adhesion between the resin surface and the plated metal.

Copper Immersion

The copper is supplied from a solution, either simple or complex, or from a colloid or suspension. In any event, the copper is usually present as the cupric salt. The pre-treated surface is immersed in the copper bath for a period of time ranging from 15 seconds to about 10 minutes, to cause at least a portion of the copper salt to become adsorbed on the surface, either during immersion or during a subsequent treatment.

In more detail, the copper is supplied in any one of the following forms:

(a) A clear solution containing a simple cupric compound such as copper sulfate, copper chloride, copper acetate, copper propionate, copper formate and copper nitrate.

The concentration of the copper in solution is 0.0005 moles/liter (m/l) to saturation. A concentration of around 0.1 m/l is preferred. The pH of the solution is between 3.5 and the upper limit at which the hydroxide forms. The presence of an additional anion in the solution has the advantage of allowing the pH of the solution to be maintained at a higher level without precipitation. The anion may be supplied by a suitable alkali or alkaline earth metal salt such as NaCl, $Na_2SO_4$, $KNO_3$, or $CaCl_2$. The ratio of the anion to the copper is between 1 to 1 and saturation.

(b) Basic cupric hydrate suspensions or sols made by adding an alkali such as NaOH, $NH_4OH$, KOH or $Na_2CO_3$ to any one of the simple copper compounds mentioned above. The concentration of copper in the sol is 0.0005 to 0.6 m/l, preferably about 0.06 m/l. The pH of the sol is between 3.9 and 10. Included herewith are hydrate sols such as of $CuCl_2$ which is stable in a pH range of 3.9 to 5.9, and copper acetate or propionate which are stable in the pH range of 5.5–6.3. These metal salts can be reduced without the subsequent nickel step by using sodium borohydrite as a reducer in a concentration of 1 to 50 g/l. However, when the subsequent nickel step is used, the concentration of the reducer can be lowered to 0.2–1 g/l with even better results.

Also included are unstable suspensions made from a compound such as copper sulfate, copper formate or copper nitrate or from one of the normally stable compounds but at a pH above the stability point. These do not work as satisfactorily as the stable sol but can nevertheless be used when followed by a good nickel or cobalt immersion step. The stability and thus the usability of any of these can be improved by the addition of between 1 and 100 g/l of a polyhydric alcohol such as sorbitol, mannitol or glucose.

The stable colloid is typically prepared by dissolving between 0.03 and 5% of copper chloride, copper acetate or copper propionate in water. To this solution is slowly added the selected base in an amount sufficient to form a stable colloidal sol, but insufficient to coagulate the sol. The base is used in an amount equivalent to 3–60% of the stoichiometric equivalent amount required to react with all of the copper salt and to convert it to the hydroxide. The concentration of the base is normally between 1 to 10% and the temperature of the solution is maintained between room temperature (18°–20° C.) and 70° C. during the addition of the base. The pH is maintained in a range where coagulation does not occur.

The resultant stable colloid has a milky blue-green to green appearance and is normally inpenetrable by a Tyndall beam. When diluted to a concentration of 0.5% the stable sol has a zeta potential of between +28 and +46. It is quite stable as evidenced by a very limited amount of settling, even upon standing for several weeks. The size range of the particles in the colloid is between 70 Å and 1750 Å.

(c) Clear cuprate ($Na_2CuO_2$) solutions made by adding a high concentration of an alkali (6–10 normal) to any of the soluble cupric compounds previously described such as copper sulfate, copper chloride, copper acetate, copper propionate, copper formate and copper nitrate.

(d) Clear or slightly turbid complex solutions of copper, typically prepared by the addition of a complexing agent to a soluble cupric compound at a pH above 4. The copper concentration is between 0.0005 and 2 m/l with a preferred range between 0.01 and 0.2 m/l. The molar ratio of the complexing agent or ligand to the copper is generally between 1 and 30. Ratios below 1 generally result in incomplete complexing of the copper. As a practical matter, the ratio should be kept as low as possible, seldom above about 20.

The following table lists a number of complexers that have been successfully used with copper at 0.1 molar to give a complex solution which is capable of being followed with an appropriate nickel treatment to prepare a polymeric substrate for electroless deposition of copper. Except for cyanide and ethylene diamine tetra acetic acid (EDTA), which has a limiting upper ratio of 4 or 5 to 1 with respect to copper, the other complexers can be used in molar ratios as high as 20 to 1.

TABLE I

| Monodentates | Chelates |
| --- | --- |
| CN (for $Cu^{30}$) | Sorbitol |
| $NH_3$ | Gluconate |
| $N_2H_4$ | Tartrate |
| Pyridine | $P_2O_7$ |
| Triethanalomine (TEA) $N(CH_2CH_2OH)_3$ | Citrate |
| Methylamine $NH_2CH_3$ | Glycine |
| T-butylamine $(CH_3)_3 C—NH_2$ | Ethylenediamine (EN) |
| Piperidine $C_5H_{10}NH$ | Lactate |
| Dequest 2010 - phosphate analog of EDTA - Monsanto Chemical Company | Dextrose |
| | EDTA |
| Dequest 2054 - phosphate analog of EDTA - Monsanto Chemical Company | Salicylate |

The pH of the complexed solution during immersion will often have a noticeable effect on the process. For example, identical etched ABS panels are immersed in a copper bath complexed with EDTA in a mol ratio of 1 to 1 followed sequentially by immersion in a nickel bath, rinsing reduction and immersion in an electroless copper bath. When the pH of the copper complex is between 4.5 and 6.5, there is no electroless copper coverage in the subsequent electroless bath. However, where the pH of the copper complex is 10.85, good coverage is subsequently obtained. When citrate is used as a complexer in a ratio of 20 to 1, there is no coverage with the pH of the complex at 6.5. However, good coverage is subsequently obtained when the pH is raised to 11.7.

Also included is the use of mixed complexers for copper. For example, a mixture of sodium tartrate and the sodium salt of ethylene diamine tetra acetic acid will successfully complex $CuSO_4$.

(e) Selected monovalent copper complexes can be used in the teaching of the present invention. Among these are complexes of a halide and copper where the copper concentration is 0.03 to 0.2 molar and wherein the mol ratio of the halide to the copper is between 3 to 1 and 10 to 1. The pH of the cuprous complex is held below 3.5. Typically, this complex may be prepared from a solution containing 0.05 m/l of CuCl and 150 g/l of NaCl or $CaCl_2$. An anti-oxidant such as 5 g/l of resorcinol is added to prevent the copper from returning to the bivalent state. This complex can be used with all nickel or cobalt accelerator systems except those involving an inert complex solution such as nickel and ethylene diamine tetra acetic acid.

Another monovalent complex is made by adding NaCN or KCN to 5-50 g/l of CuCN at a pH of about 12 to form a cuprous cyanide complex. A tin chloride—cuprous chloride—HCl solution can also be used but both of these give only fair results even when followed by a good nickel or cobalt accelerator dip. Generally, monovalent copper complexes using thiourea as a complexer or using an excess of cyanide are not satisfactory.

(f) In some instances, the addition of a solvent such as dimethyl sulfoxide, dimethyl formamide or Cellusolve (2L -ethoxyethanol-1) to a simple or complexed copper solution serves to reduce the subsequent coverage time of the electroless layer.

Although the copper is adsorbed on the polymeric surface, this adsorption does not necessarily occur while immersed in the copper bath. Instead, the adsorption or part of it may occur during the rinse step or during the subsequent immersion in the nickel or cobalt bath.

TREATMENT WITH NICKEL OR COBALT ACCELERATOR

Following the treatment of the non-metallic polymeric surface with the copper solution or suspension, the surface is immersed, with or without an intermediate rinse step, in a solution or suspension of nickel or cobalt for a period of 15 seconds to 10 minutes. This may be preceded by rinsing in clear water at a neutral pH to remove excess metal salts from the surface. However, in some instances, this intermediate step can be omitted. Nickel and cobalt may be used somewhat interchangeably and when reference is made to one, it will likewise be applicable to the other. The nickel or cobalt bath is maintained at a pH of 4 or above during immersion.

Although the role of the nickel or cobalt is not clear, it appears to catalyze the reduction of copper in contact with the borohydride and/or during the deposition from the electroless copper bath. The nickel or cobalt can be used as a simple solution in which the concentration of the metal is between 0.0005 m/l and saturation. A preferred range is around 0.1 m/l. $NiCl_2$, $NiSO_4$, and $Ni(NO_3)_2$ are examples of nickel compounds while $CoSO_4$ and $CoCl_2$ represent suitable cobalt compounds. The simple solution may contain an additional anion supplied by an appropriate alkali metal or alkaline earth metal salt. The weight ratio of the metal to the anion is between 1 to 1 and 1-saturation. The pH of the simple solution is in the range of from 2 units below the precipitation pH up to the point at which precipitation occurs. Preferably, the pH is maintained slightly below the precipitation point.

Satisfactory results are also obtained when a turbid suspension is formed by adding an alkali such as NaOH, KOH, $NH_4OH$, $Na_2CO_3$ or methylamine to one of the clear simple solutions in a concentration of 0.0005-0.6 m/l at a pH ranging from the precipitation point to one unit above the precipitation point. Although the suspension is not colloidally stable, it can be used to accelerate the reduction of the copper. The stability of these suspensions is improved by the addition of between 1 and 100 g/l of a polyhydric alcohol such as sorbitol, mannitol or glucose.

Complex solutions (clear or slightly turbid) of nickel or cobalt can also be used at an effective pH above 6.0 provided the mol ratio of ligand to the metal is kept within limits. Various monodendates such as cyanide, ammonia, pyridine, triethanolamine and hydrazine may be used, with due regard to the solubility and viscosity of the resultant solution. Furthermore, most if not all of the chelates that are found to be satisfactory for the formation of a copper complex solution are usable. If the chelating agent is relatively weak and has few carboxyl groups, the ratio of the ligand to the metal must be somewhat higher than with the stronger chelates. Furthermore, if the stability constant of the chelate is relatively high, a lower ratio of ligand to metal is preferable.

As is the case of the copper complexes, the pH of the bath is quite important. For example, if an ABS panel is first treated with a solution of copper acetate and is thereafter immersed in a complex nickel solution containing gluconate as the complexing agent, good electroless depositions are obtained at a pH of 8.75 but if the pH is raised to 11.0, no coverage is obtained. On the other hand, if gluconate is used in a bath having a concentration of 0.1 m/l of nickel, coverage is good at a pH of 8. However, if the gluconate concentration is increased to 1 m/l (a molar ratio of 10 to 1) the subsequent electroless copper coverage is poor.

It should be noted that some of the ligands such as sorbitol, tartrate and simple amines form soluble complexes with copper whereas the nickel complex is quite insoluble but useful. Sorbitol can be used to stabilize basic nickel compounds as colloids when formed. With nickel salts such as nickel acetate and nickel chloride, a solvent such as Cellusolve can be satisfactorily used in placed of water.

REDUCTION STEP

Following exposure of the polymeric surface to the copper and to the nickel, the surface is rinsed after which the adsorbed layer is reduced to metallic copper and nickel or nickel boride by contacting the same with a borohydride, a borane or a hydrazine reducing agent.

Sodium borohydride and potassium borohydride are the preferred reducing agents and can be used in a concentration range as high as 50 g/l although totally satisfactory results are obtainable with less than 2 g/l for a period of a few seconds to 20 minutes, typically about 5 minutes. The pH is preferably between 10 and 12.2. Similar results are obtained by contacting the surface with hydrazine or hydrazine hydrate in a concentration of 2-40% at a pH above 12 and a temperature above 40° C. for a period of time between 30 seconds and 5 minutes.

Not to be overlooked is the use of a borane compound such as dimethylamineborane or ammonia borane in a range of 5 to 50 g/l. Reduction with a borane compound is typically carried out at room temperature and a pH of between 11 and 12.

ELECTROLESS PLATING

After the metal salt has been reduced to the metal, the substrate is again rinsed and is immersed in an electroless plating bath of copper, nickel or gold. There are a number of such baths commercially available and several are reported in the 3rd Edition of *Modern Electroplating*. A typical composition of a copper electroless plating bath is shown at p. 736 of the 3rd Edition as follows:

| | |
|---|---|
| $CuSO_4 . 5H_2O$ | 3.6-30 g/l |
| NaK Tartrate . $4H_2O$ | 0-142 g/l |
| $Na_2EDTA . 2H_2O$ | 0-20 g/l |
| HCHO | 10-167 milliliters/liter |
| NaOH | 7-50 g/l |
| $Na_2CO_3$ | 0-32 g/l |
| Stabilizers | |

With an agitated bath of this type, maintained at a temperature of 25° C. and a pH of between 12 and 13.5 in which the following concentrations are used: copper sulfate—30 g/l, NaK Tartrate—99 g/l, sodium hyrroxide—50 g/l, sodium carbonate—32 g/l and formaldehyde—29 g/l, the rate of deposition is about 2.5 millimicrons per hour.

Other commercial electroless copper baths that can be used in connection with the present invention are Dynaplate Electroless Copper 808 marketed by Dynachem Corp. and xp 990 Electroless Copper sold by Shipley Co.

Although the two step preplate process of the present invention works very well to catalyze the surfaces of polymeric substrates for electroless deposition of copper, other metals including nickel and gold can also be electrolessly deposited onto the prepared surface. Nickel is successfully plated from an electroless bath such as:

| | |
|---|---|
| Nickel acetate | 60 g/l |
| glycolic acid | 60 g/l |
| tetrasodium salt of EDTA | 10 g/l |
| hydrazine hydrate (100%) | 100cc/l |
| pH at room temperature | 12 |
| operating temperature | 50° C. |

This bath is described in Plating 54, 385 (1967).

Another suitable electroless nickel bath has the following composition:

| | |
|---|---|
| $NiCl_2 . 6H_2O$ | 28 g/l |
| EN | 60 cc/l |
| NaOH | to pH 12.5 |
| $NaBH_4$ | 0.8 g/l |
| Temperature | 60°-63° C. |

Similarly, gold can be electrolessly deposited onto the catalyzed substrate from a bath having the following composition:

| | |
|---|---|
| Potassium gold cyanide | 5.8 g/l |
| Potassium cyanide | 13.0 g/l |
| Potassium hydroxide | 11.2 g/l |
| Sodium borohydride | 1.0 g/l |
| pH | 10.4 |
| Temperature | 64° C. |

The panel is removed from the electroless bath after a few minutes following which it can, if desired, be plated with a layer of bright acid copper from an electroplating bath such as the Electra ® bright acid copper bath marketed by The Hershaw Chemical Company. This bath has the following general composition:

| | |
|---|---|
| $CuSO_4 . 5H_2O$ | 200 g/l |
| $H_2SO_4$ | 50 g/l |
| $Cl^-$ | 40 ppm |
| Brighteners (proprietary) | |

Plating is typically carried out in an air agitated bath maintained at room temperature using a current density of between 10-80 amps/$ft^2$ until a deposit of the required thickness is achieved.

The following examples are presented to further illustrate the teachings of the present invention.

EXAMPLE 1

A 1% CuCl$_2$.2H$_2$O solution was prepared at an initial pH of 4.2. NaOH (1.9 N) is added with agitation at room temperature to form an insoluble hydrous copper compound. The addition was continued until a colloidal sol was formed at a pH of 5.3–5.5. The sol was milky blue-green in appearance.

A 3"×4" panel of ABS (acrylonitrile butadiene styrene) was etched in CrO$_3$/H$_2$SO$_4$ and was immersed in the copper sol for a period of three minutes at 60° C. at a pH of 4.5. The panel was rinsed in water at a pH of between 7 and 7.7 and was then immersed in a 4% NiCl$_2$ solution at a pH of 7.3 for a period of 2 minutes. At this pH, the nickel solution is close to turbidity. The panel was rinsed and then immersed in NaBH$_4$ reducing solution for ten minutes. The panel was then compared with other ABS panels treated identically but without immersion in the nickel chloride solution.

The panels were then placed in an electroless copper bath and the time required to fully cover the panels was measured with the following results:

| Concentration of NaBH$_4$ (%) | pH | Time (seconds) With Nickel | Without Nickel |
|---|---|---|---|
| 3% | 10.4 | 10 | 15 |
| 0.2% | 10.4 | 15 | 35 |
| 0.2% | 12 | 20 | 120 |

EXAMPLE 2-7

In these examples, the following conditions and cycles were used:

(a) ABS panels 3"×½" were etched for 5 minutes at 140° C. in an etch solution of CrO$_3$/H$_2$SO$_4$ after which they were rinsed.

(b) The panels were immersed for a period of 4 minutes in a copper bath followed by a water rinse.

(c) The panels were immersed for 2 minutes in a bath containing nickel or cobalt, again followed by a rinse.

(d) The panels were immersed for 5 minutes in a 1 g/l NaBH$_4$ solution at room temperature followed by a rinse.

(e) The panel was then immersed with slow agitation into an electroless copper bath maintained at a pH of between 12 and 12.5.

The panels were graded according to the rate of visible coverage of the panels in the electroless copper bath, as follows: very good (VG)—coverage in less than 30 seconds; good (G)—coverage in 30–60 seconds; fair (F)—coverage in 1–2 minutes; poor (P)—at least 50% coverage in 2 minutes and complete coverage in 4 minutes; very poor (VP)—between 5 and 50% coverage in 2 minutes and no good (NG)—less than 5% coverage in 2 minutes.

EXAMPLE 2

Ten panels were immersed in a copper hydrate sol prepared according to the teachings of Example 1 followed by immersion in four different nickel baths as follows:

2a—Nickel-Sorbitol (0.1 M NiSO$_4$, 60 g/l sorbitol, pH 7.2)
2b—Ni-EN (0.1 M NiSO$_4$, 0.3 M EN, pH 10.1)
2c—Ni-Gluconate (0.1 M NiSO$_4$, 0.15 M gluconate)
2d—Ni-EDTA (0.1 M NiSO$_4$, 0.1 M EDTA, pH 7.9)

Two panels were immersed in each nickel bath followed by reduction in the standard sodium borohydride solution at a pH of 10.4 or 11.7. In addition, another panel was immersed in bath 2a and in bath 2d, followed by reduction in 0.2 g/l sodium borohydride at a pH of 10.4. The results are as follows:

| Nickel Bath | pH 10.4 (1 g/l) | pH 10.4 (0.2 g/l) | pH 11.7 |
|---|---|---|---|
| 2a | VG | G | VG |
| 2b | VG |  | VG |
| 2c | VG |  | VG |
| 2d | VG | NG | VP |

EXAMPLE 3

Five panels were immersed in a copper complex bath composed of 0.1 m/l of copper sulfate and 0.2 m/l of ethylene diamine at a pH of 12.5. Each of the panels were then immersed in a nickel or cobalt complex followed by reduction and electroless plating. Panels 3a and 3b were immersed in the nickel-ethylene diamine bath of Example 2b followed by reduction of each at a different pH. Panel 3c was immersed in a nickel-ethylene diamine bath composed of 0.1 molar nickel sulfate and 0.3 molar ethylene diamine, at a pH of 10.1. Panel 3d was immersed in a nickel glycolate bath prepared from nickel nitrate (0.1 mol) and glycolic acid (0.2 moles) at a pH of 7.5. Panel 3e was immersed in a cobalt-sorbitol complex (0.1 mol CoSO$_4$, 75 g/l of sorbitol and a pH of 7.5). The plating results are tabulated below:

| Panel | pH of Reducer | Results |
|---|---|---|
| 3a | 11.7 | P |
| 3b | 10.4 | G |
| 3c | 10.4 | NG |
| 3d | 10.4 | VG |
| 3e | 10.4 | VG |

EXAMPLE 4

Several different copper immersion baths were prepared as follows:

Copper Tartrate (0.1 M CuSO$_4$, 1.0 M rochelle salts, pH 6.1)
Cuprous Chloride-Calcium Chloride (5 g/l CuCl, 150 g/l CaCl$_2$, 5 g/l resorcinol, pH 2.0)
Copper Acetate (0.1 M, pH 5.4)
Copper Acetate—dilute (0.0005 M, pH 6.75)
Copper Citrate #1 (0.1 M CuSO$_4$, 0.1 M sodium citrate, pH 4.6)
Copper Citrate #2 (0.1 M CuSO$_4$, 0.4 M sodium citrate, pH 6.5)
Copper-EDTA #1 (0.1 M CuSO$_4$, 0.1 M EDTA, pH 6.5)
Copper-EDTA #2 (0.1 M CuSO$_4$, 0.1 M EDTA, pH 10.85)
Cuprate (0.025 M CuCl$_2$, 14 M NaOH)
Copper Acetate-Sorbitol (0.1 M Cu Acetate, 75 g/l sorbitol, pH 5.7)

The panels were immersed in these copper baths for four minutes followed by a two minute immersion in a nickel-sorbitol or nickel-ethylene diamine bath described in Examples 2 or 3 or in one of the following baths:

Nickel Acetate #1 (0.1 M, pH 7.1)
Nickel Acetate #2 (0.0005 M, pH 8.6)

Nickel Propionate (0.1 M NiSO$_4$, 0.4 M propionic acid, pH 7.4) or

Nickel Acetate-Sorbitol (0.1 M Ni Acetate, 75 g/l sorbitol, pH 7.6)

The panels were then immersed for five minutes in sodium borohydride at the pH indicated in Table 4 followed by electroless copper deposition with the following results:

| Panel No. | Immersion Copper Bath | Immersion Nickel Bath | Reduction pH | Results |
|---|---|---|---|---|
| 4a | Cu Tartrate | Ni Sorbitol | 11.7 | Good |
| 4b | CuCl-CaCl$_2$ | Ni-EN | 11.7 | VG |
| 4c | Cu Acetate #1 | Ni Acetate #1 | 10.4 | VG |
| 4d | Cu Acetate #2 | Ni Acetate #2 | 10.4 | Fair |
| 4e | Cu Citrate #1 | Ni Sorbitol | 10.4 | VG |
| 4f | Cu Citrate #2 | Ni Sorbitol | 10.4 | NG |
| 4g | Cu EDTA #1 | Ni Sorbitol | 10.4 | NG |
| 4h | Cu EDTA #2 | Ni Sorbitol | 10.4 | Good |
| 4i | Cuprate | Ni-EN | 10.4 | VG |
| 4j | Cu Acetate | Ni Propionate | 10.4 | VG |
| 4k | Cu Acetate-Sorbitol | Ni Acetate-Sorbitol | 10.4 | VG |

EXAMPLE 5

Adhesion tests were carried out on four ABS panels, 3"×4", that were initially immersed in copper and nickel baths and were reduced in sodium borohydride according to the treatment specified for panels 2b (copper hydrate/nickel-EN), 3e (copper-EN/Co sorbitol), 4c (copper acetate/nickel acetate) and 4k (copper acetate sorbitol/nickel acetate sorbitol). These panels were electroless copper plated for five to ten minutes and were then plated with 50 millimicrons of bright acid copper. The copper on each panel was then cut to form a 1" wide strip. A tab of this strip was clamped into a spring scale tensimeter, and the maximum force required to pull the strip is recorded on the scale as follows:

Panel 2b  6.5 pound per inch
Panel 3e  14 pounds per inch
Panel 4c  11 pounds per inch
Panel 4k  12.5 pounds per inch In addition, an unetched ABS panel was alkaline cleaned and after rinsing was immersed in the baths used for panel 4c. Similarly, a panel was treated in the same baths used on panel 4k. Electroless coverage was obtained in less than 1 minute on panels reduced with borohydride at pH of 10 but not at pH of 12.

EXAMPLE 6

The copper acetate-sorbitol/nickel acetate-sorbitol system of Example 4k was used as a pre-treatment on several other plastics including silica filled polypropylene, polyphenylene oxide and polyaryl ether. All three of the plastics were etched in CrO$_3$/H$_2$SO$_4$ and the polypropylene was followed with an acid fluoride etch. In all instances, the rate of electroless copper coverage was comparable to that obtained on ABS plastic.

EXAMPLE 7

Although sodium borohydride is the preferred reducing agent, hydrazine hydrate and dimethylamine borane can also be used under certain circumstances. A small ABS panel was immersed in the copper hydrate bath of Example 2 followed by immersion in the nickel-sorbitol bath of Example 2a. The panel was then reduced in a 10% solution of hydrazine hydrate at a pH of 13.5 and at a temperature of 70° F. after which the panel was completely covered by electroless copper in 40 seconds. Generally, the hydrazine hydrate is useful only when copper hydrate is used as the first bath. The concentration of the hydrazine hydrate should be between 2 and 40%, and the pH should be above 12 (as measured at room temperature). Reduction should be carried out at a temperature above 40° C., preferably between 65° C. and 70° C.

Two grams per liter of dimethylamine borane at a pH of 9.4 was used as a reducer on three panels immersed in the following baths: copper acetate-sorbitol followed by nickel acetate-sorbitol with very good results; copper tartrate followed by cobalt-sorbitol with no coverage and copper-EN followed by cobalt-sorbitol with good results. In general, the dimethylamine borane is not as effective as the sodium borohydride.

EXAMPLE 8

A small etched ABS panel was immersed in a copper solution containing 12.5 grams of cuprous chloride, 28.4 grams of stannous chloride, 75 cc of HCl and 50 cc of water. After 4 minutes the panel was removed from the solution, was rinsed and was immersed in a sodium borohydride solution for 5 minutes. It was again rinsed and was then immersed in electroless copper solution. Complete coverage of electroless copper was obtained within 3 minutes.

Another ABS panel was treated in the same manner, but in addition was immersed in a nickel-sorbitol bath before reduction. A resultant copper coating in the electroless bath was formed much more quickly with complete coverage being obtained within 1–2 minutes.

EXAMPLE 9

To determine the effect of various solvents on electroless plating, ABS panels were immersed in various copper solutions for 4 minutes and after rinsing was immersed in a 0.1 M nickel acetate solution for 2 minutes followed by reduction in borohydride for 5 minutes. The baths and time required to obtain complete coverage with electroless copper are as follows:

|  | Coverage Time (Sec) |
|---|---|
| CuSO$_4$ (0.1M) - Ethylenediamine (0.2M) | 20 |
| Same with 25 vol. % Cellusolve | 15 |
| Cu acetate (0.1M) | 15 |
| Same with 25 vol. % dimethylsulfoxide | 10 |
| Cu tartrate (CuSO$_4$-0.1M, Rochelle salts 0.1M) | 30 |
| Same with 25 vol. % dimethylformamide | 25 |

Although the rate of coverage of all of the panels was very good, slightly faster coverage was obtained with the solvents.

EXAMPLE 10

ABS panels were immersed in 2.5 g of copper acetate in 100 cc of Cellusolve for 4 minutes and after rinsing were immersed for 2 minutes in either nickel acetate or nickel chloride solution prepared by adding 2.5 g of the respective salt to 100 cc of Cellusolve. After borohydride reduction for 5 minutes, coverage of electroless copper was obtained in 30 seconds or less. No coverage was obtained when the copper solution or the nickel solution was used by itself.

EXAMPLE 11

Etched ABS panels pretreated according to Example 2b using copper hydrate followed by nickel-ethylenediamine and 4k using copper acetate-sorbitol followed by nickel acetate-sorbitol were plated in the electroless gold plating bath previously described at a temperature of 65° C. The first panel (2b) was covered with gold in 20 seconds and the second panel (4k) was covered in 60 seconds.

EXAMPLE 12

Etched ABS panels prepared according to Example 11 were treated in an electroless nickel bath using a hypophosphite reducing agent without success. However, using the electroless nickel bath described in Plating 54, 385 (1967), at a room temperature pH of 12, and an operating temperature below 50° C. coverage was obtained in 25 seconds on the panel pretreated in copper hydrate and nickel sorbitol. Approximately 45 seconds was required to obtain coverage on the panel pretreated with copper acetate-sorbitol followed by nickel acetate-sorbitol.

Additional etched ABS panels were treated in copper hydrate followed by ethylenediamine and in copper acetate-sorbitol followed by nickel sorbitol and were then immersed in the nickel chloride electroless bath previously described using sodium borohydride as a reducer. Although no nickel deposition occurred at room temperature, the panels were coated with electroless nickel in 45-60 seconds at 60°-63° C.

The process of the present invention can be carefully controlled to allow the plating of etched non-metallic objects using racks or containers coated with plastisol without depositing copper on the plastisol. Baths that have been found to be effective for this purpose are cuprous chloride-calcium chloride followed by nickel chloride or by nickel sorbitol; copper chloride followed by nickel chloride, copper gluconate followed by nickel sorbitol; copper tartrate followed by nickel sorbitol; copper acetate-ammonium acetate followed by nickel sorbitol and copper acetate followed by nickel acetate.

Although it is possible to reverse the immersion process utilizing the nickel or cobalt bath followed by the copper bath, the results generally are not as favorable as those obtained by using copper immersion followed by nickel or cobalt immersion. If the nickel bath is used first, the conditions of the copper bath must be such that the nickel is not dissolved. For example, if a panel is immersed for 4 minutes in a nickel-sorbitol bath followed by immersion in a complexed copper bath using TEA, gluconate or tartrate as a complexer, the panels can be subsequently covered in 1-2 minutes with a layer of electroless copper.

In addition to the aforementioned advantages, the present process permits more uniform reduction than known prior art processes because the present invention does not depend upon drying of the copper and the nickel salts on the surface of the plastic prior to reduction. Stated differently, the ability to rinse the plastic substrate after the two immersion steps and before reduction helps to insure a uniform adsorption of the activator precursor on the surface prior to reduction.

The foregoing description and examples have been presented to clearly show the utility and applicability of the present invention in the preparation of non-metallic, polymeric surfaces to allow them to be plated with an electroless layer of copper, tin or gold. It is to be understood, however, that the present invention is not to be limited in scope of the specific parameters embodied in the examples.

Instead, the invention is to be measured in terms of the claims in which I claim:

1. A process of preparing a non-metallic surface for the electroless deposition of a metallic layer of copper, nickel or gold comprising the steps of
    (a) contacting the surface with a copper compound available from a bath selected from the group consisting of
        (1) a solution of a simple cupric compound;
        (2) a basic cupric hydrate suspension or colloid prepared by adding an alkali to the solution of (1);
        (3) a clear cuprate solution; and
        (4) a complex solution of copper containing a suitable complexing agent;
    (b) thereafter contacting the surface with an accelerator selected from the group consisting of
        (1) a nickel salt; and
        (2) a cobalt salt
        available as a simple solution, suspension or a complex solution;
    (c) rinsing the surface; and
    (d) contacting the surface with a reducing agent selected from the group consisting of a borohydride, hydrazine and a borane.

2. The process of claim 1 wherein the contact time with the copper compound is between 15 seconds and 10 minutes.

3. The process of claim 2 wherein the surface is rinsed following contact with the copper compound.

4. The process of claim 1 wherein a borohydride is used as the reducing agent in a concentration of less than 2 g/l.

5. The process of claim 2 wherein the copper is present as a copper hydrate colloid prepared by reacting in solution a copper salt selected from the group consisting of copper chloride, copper acetate and copper propionate with a base selected from the group consisting of sodium hydroxide, potassium hydroxide, ammonium hydroxide and sodium carbonate in a pH range and temperature range at which coagulation does not occur.

6. A process according to claim 2 wherein the surface is contacted with a copper solution containing a simple cupric compound selected from the group consisting of copper sulfate, copper chloride, copper acetate, copper propionate, copper formate and copper nitrate.

7. The process according to claim 2 wherein a complex copper solution is prepared by adding a complexing agent to a soluble cupric compound at a pH above 4.

8. A preplating process for preparation of a polymeric article including the sequential steps of
    (a) immersing the article in a copper bath for a time interval ranging from 15 seconds to 10 minutes, said copper bath selected from the group consisting of
        (1) a clear aqueous solution containing a cupric compound wherein the copper is present in a concentration range of 0.0005 m/l to saturation;
        (2) a basic hydrate sol or suspension formed by adding an alkali to the clear solution of (1) until the final pH is between about 3.9 and about 10 wherein the concentration range of the copper in the sol is 0.0005 L to 0.6 m/l;

(3) a clear cuprate solution formed by adding a high concentration of an alkali to the solution of (1);

(4) a complex solution of copper formed by the addition of a complexing agent to the clear solution of (1) wherein the concentration range of the copper is 0.0005 to 2 m/l;

(5) a momovalent complex of a copper halide or of a copper cyanide containing no excess cyanide; and (6) a clear or complexed cupric solution containing an organic solvent;

(b) immersing the article in a nickel or cobalt bath maintained at a pH of 4 or above for a period of time between 15 seconds and 10 minutes, said bath selected from the group consisting of (1) a simple solution in which the concentration of the nickel or cobalt is between 0.0005 m/l and saturation;

(2) a suspension formed by adding an alkali to the solution of (b) (1) in which the nickel or cobalt concentration is 0.0005 to 0.6 m/l;

(3) a stable suspension formed by the addition of 1-100 g/l of a polyhydric alcohol to the suspension of (b) (2); and (4) a complex solution formed by the addition of a complexing agent to the simple solution of (b) (1) at an effective pH above 6.0;

(c) rinsing the article with water to remove excess bath material; and (d) immersing the article in a bath containing a reducing agent selected from the group consisting of a borohydride, hydrazine and a borane.

* * * * *